US012777588B2

(12) United States Patent
Shimizu et al.

(10) Patent No.: US 12,777,588 B2
(45) Date of Patent: Oct. 27, 2026

(54) MOTOR CONTROL DEVICE

(71) Applicant: MITSUBA Corporation, Gunma (JP)

(72) Inventors: Nobuhiro Shimizu, Gunma (JP); Yasufumi Noguchi, Gunma (JP); Hikaru Sawada, Gunma (JP)

(73) Assignee: MITSUBA Corporation, Gunma (JP)

( * ) Notice: Subject to any disclaimer, the term of this patent is extended or adjusted under 35 U.S.C. 154(b) by 111 days.

(21) Appl. No.: 18/852,491

(22) PCT Filed: Mar. 5, 2024

(86) PCT No.: PCT/JP2024/008353
§ 371 (c)(1),
(2) Date: Sep. 29, 2024

(87) PCT Pub. No.: WO2025/069496
PCT Pub. Date: Apr. 3, 2025

(65) Prior Publication Data
US 2026/0020156 A1 Jan. 15, 2026

(30) Foreign Application Priority Data
Sep. 29, 2023 (JP) ................................ 2023-169964

(51) Int. Cl.
*H05K 1/181* (2026.01)
*H02K 11/33* (2016.01)
(Continued)

(52) U.S. Cl.
CPC ............. *H05K 1/181* (2013.01); *H02K 11/33* (2016.01); *H05K 5/03* (2013.01); *H05K 7/1427* (2013.01); *H02K 2211/03* (2013.01)

(58) Field of Classification Search
CPC .... H05K 1/18; H05K 1/181–185; H05K 5/03; H05K 5/0214; H05K 7/1427; H05K 7/14322; H05K 7/48; H02K 11/33
(Continued)

(56) References Cited

U.S. PATENT DOCUMENTS 7,151,674 B2 * 12/2006 Sasaki .................. H05K 5/0034 361/752
8,520,397 B2 * 8/2013 Azumi ................. H05K 5/0069 361/752
(Continued)

FOREIGN PATENT DOCUMENTS

JP 2006005162 1/2006
JP 2021061670 4/2021
(Continued)

OTHER PUBLICATIONS

"International Search Report (Form PCT/ISA/210) of PCT/JP2024/008353", mailed on Apr. 23, 2024, pp. 1-3.
(Continued)

*Primary Examiner* — Tuan T Dinh
(74) *Attorney, Agent, or Firm* — JCIPRNET

(57) ABSTRACT

A motor control device includes a printed circuit board, a terminal connection member having an element connection part connected to a switching element and a terminal part to which external wiring is detachably connected, and a case. The case includes a base member, a main cover that covers a part where the printed circuit board is provided and that is attached to the base member in a state in which the terminal part protrudes in a first direction, a filter provided to cover a communication hole formed in the main cover, and a sub-cover provided detachably provided with respect to the
(Continued)

base member so as to cover the terminal part. The sub-cover integrally includes a filter cover part provided to cover the filter.

3 Claims, 8 Drawing Sheets

(51) Int. Cl.
*H05K 5/03* (2006.01)
*H05K 7/14* (2006.01)

(58) Field of Classification Search
USPC ......... 361/752–753, 775–778, 803; 439/76.2
See application file for complete search history.

(56) References Cited

U.S. PATENT DOCUMENTS 8,657,609 B2 * 2/2014 Yanagisawa ......... H05K 5/0056 439/79
2003/0151893 A1 * 8/2003 Meyer ................... H02M 7/003 361/689
2016/0361676 A1 * 12/2016 Zaiki .................... H05K 5/0215
2017/0223847 A1 8/2017 Nishida et al.
2021/0104879 A1 4/2021 Kobayashi et al.
2024/0001272 A1 * 1/2024 Song .................. B01D 46/0005

FOREIGN PATENT DOCUMENTS

WO 2019131004 X 7/2019
WO 2022270096 12/2022

OTHER PUBLICATIONS

"International Preliminary Report on Patentability of PCT/JP2024/008353; this report contains the following items: Form PCT/IB/326, PCT/IB/338, PCT/IB/373, PCT/ISA237(cover sheet), PCT/ISA237(Box No. I), PCT/ISA237(Box No. V)", mailed on Apr. 9, 2026, Mar. 31, 2026 and Apr. 23, 2024, which is English translation of "Written Opinion of the International Searching Authority", p. 1-p. 9.
"Examination report of India Counterpart Application", issued on Aug. 17, 2026, p. 1-p. 7.

* cited by examiner

MOTOR CONTROL DEVICE

CROSS-REFERENCE TO RELATED APPLICATION

This application is a 371 application of the International PCT application serial no. PCT/JP2024/008353, filed on Mar. 5, 2024, which claims the priority benefits of Japan Patent Application No. 2023-169964, filed on Sep. 29, 2023. The entirety of each of the above-mentioned patent applications is hereby incorporated by reference herein and made a part of this specification.

TECHNICAL FIELD

The present invention relates to a motor control device.

RELATED ART

In cases housing electronic devices such as boards, a communication hole (breathing hole) connecting the inside and the outside of the case may be provided to suppress internal pressure fluctuations in the case due to temperature changes. In this case, a filter is provided in the communication hole to suppress the entry of rainwater or foreign matter from outside the case.

Patent document 1 discloses a waterproof case having a bottom plate on which an electronic device is mounted and a top lid that covers the bottom plate. This waterproof case is equipped with a breathing hole that penetrates the top lid, a filter that covers the breathing hole, and a filter cover that is formed on the outer side surface of the top lid and covers the filter.

PRIOR-ART DOCUMENT

Patent Document

Patent Document 1: Japanese Patent Laid-open No. 2006-5162

SUMMARY OF INVENTION

Problems to be Solved by the Invention

However, as disclosed in Patent Document 1, when a filter cover part that covers the filter is provided on a top lid having a communication hole, if the filter cover part is formed integrally with the top lid, the structure of the top lid becomes complicated. On the other hand, if the filter cover part is to be detachably attached to the top lid, it leads to an increase in the number of parts and assembly man-hours.

The present invention provides a motor control device that has a filter cover part with a simple configuration while suppressing an increase in the number of parts and assembly man-hours.

In a first aspect of the present invention, a motor control device includes: a board on which a switching element for driving a motor is mounted; a terminal connection member having an element connection part connected to the switching elements and a terminal part to which an external wiring is detachably connected, the terminal connection member extending in a first direction along a main surface of the board; and a case accommodating the switching elements, the board, and the terminal connection member. The case includes: a base member that has a first surface to which the board is fixed; a main cover that covers at least a part of the first surface of the base member where the board is provided and that is attached to the base member in a state in which the terminal part protrudes in the first direction; a filter that is provided to cover a communication hole formed in the main cover and communicating between inside and outside of the case; and a sub-cover that is detachably provided with respect to the base member so as to cover the terminal part. The sub-cover integrally includes a filter cover part provided to cover the filter.

With this configuration, since the filter cover part is provided to cover the filter, it is possible to prevent external forces such as high-pressure water or flying stones from acting on the filter, and it is possible to prevent water and dust from entering the case and to allow gas to enter and exit the case in response to pressure changes therein without using a special filter that has been designed to protect against the above-mentioned external forces. Furthermore, since the sub-cover integrally includes the filter cover part, the filter cover part covering the filter is set when the main cover and the sub-cover are attached to the base member. Thus, it is possible to provide a motor control device having a filter cover part with a simple configuration while suppressing an increase in the number of parts and assembly man-hours.

In a second aspect of the present invention of the motor control device of the first aspect, it is preferable that the main cover includes: an outer surface facing a first side in a plate thickness direction of the board; and a recess part having a bottom wall through which the communication hole opens and opening to the first side in the plate thickness direction on the outer surface. The filter is provided in the recess part so as to cover the communication hole, and the filter cover part is provided in the recess part so as to face the bottom wall in the plate thickness direction with the filter interposed therebetween.

With this configuration, since the filter and the filter cover part are provided in the recess part formed in the main cover, it is possible to provide a filter cover part for covering the filter with a simple configuration. Furthermore, by providing the filter cover part in the recess part, the motor control device may be configured compactly in the plate thickness direction.

In a third aspect of the present invention of the motor control device of the first aspect or second aspect, the filter cover part is provided on the first side in the plate thickness direction spaced apart from the filter, and a gap is formed between the filter cover part and the recess part when viewed from the plate thickness direction.

With this configuration, since the filter cover part is on the first side in the plate thickness direction spaced apart from the filter, with a simple configuration, it is possible to ensure good ventilation between the inside and the outside of the main cover through the filter, while the filter cover part effectively prevents rainwater and foreign matter from the outside from reaching the filter.

Effects of Invention

According to one aspect of the present invention, it is possible to provide a motor control device having a filter cover part with a simple configuration while suppressing an increase in the number of parts and assembly man-hours.

DESCRIPTION OF THE EMBODIMENTS

Hereinafter, an embodiment of a motor control device according to the present will be described with reference to the accompanying drawings. However, the present invention is not limited to this embodiment.

Motor Control Device

Figure 1:
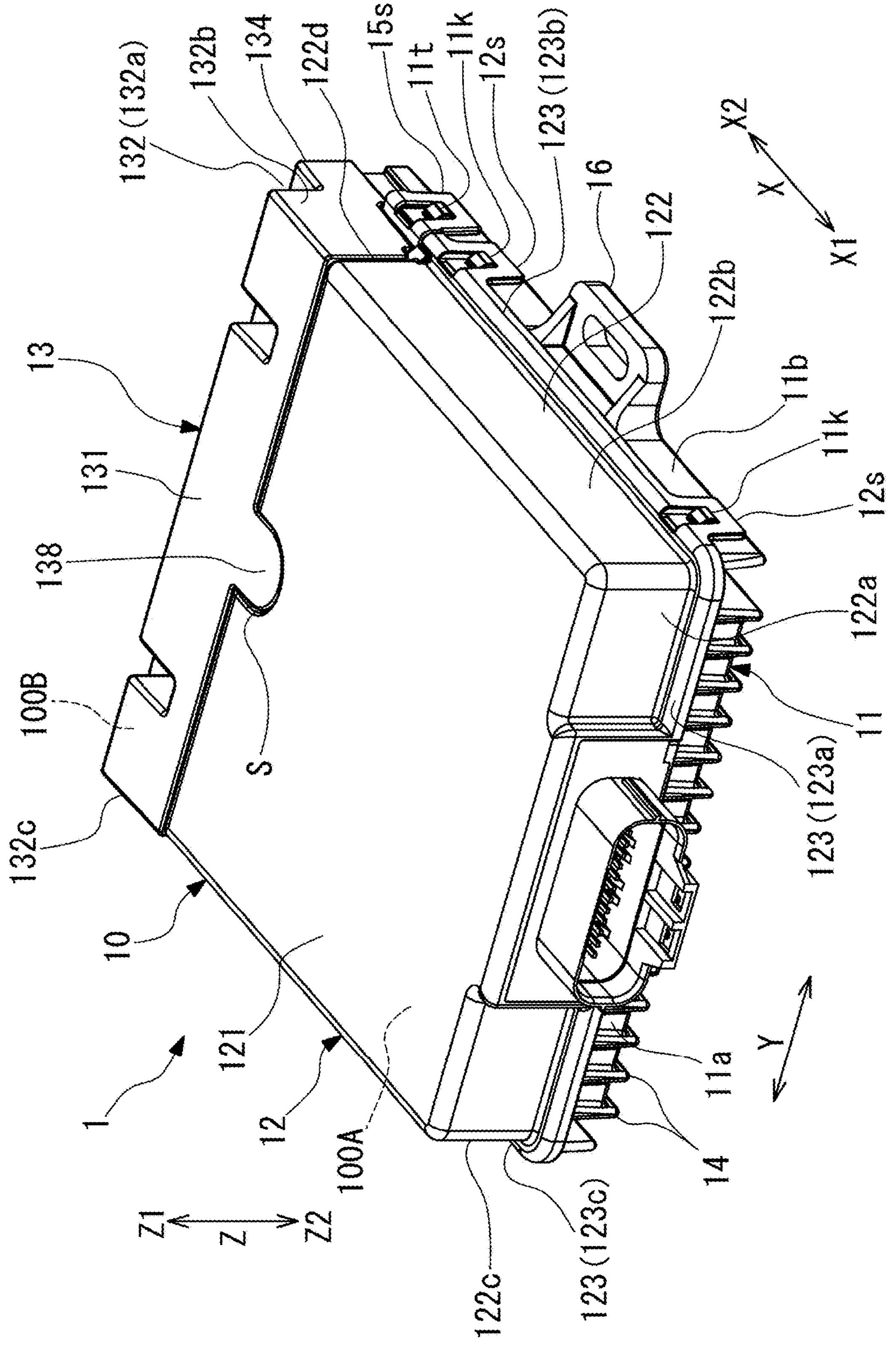
FIG. 1 is a perspective view showing a motor control device according to an embodiment of the present invention.
Figure 2:
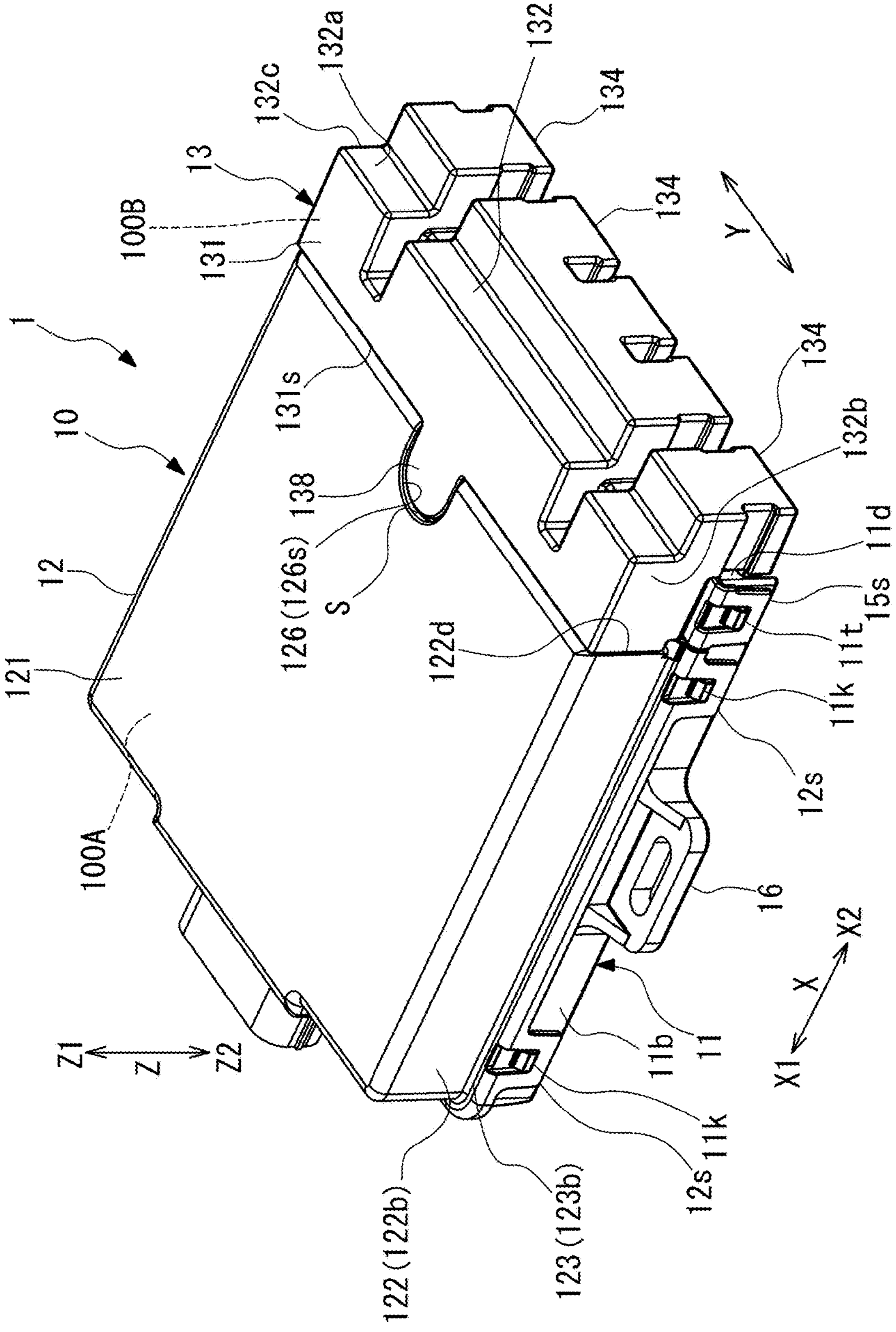
FIG. 2 is a perspective view of the motor control device of FIG. 1, seen from a different direction than that of FIG. 1.
Figure 3:
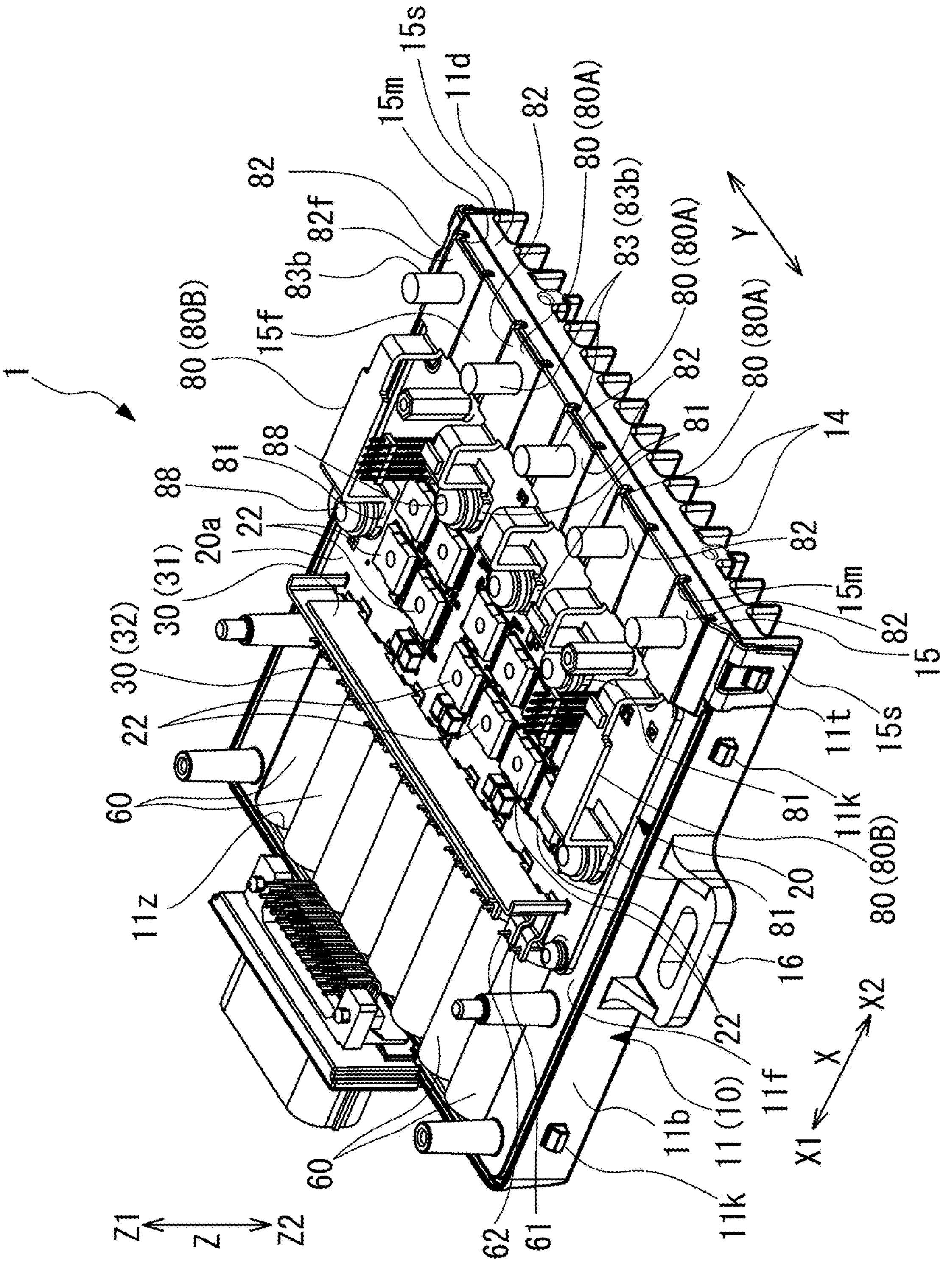
FIG. 3 is a perspective view showing a state in which a main cover and a sub-cover are removed from the motor control device of FIG. 1.
Figure 4:
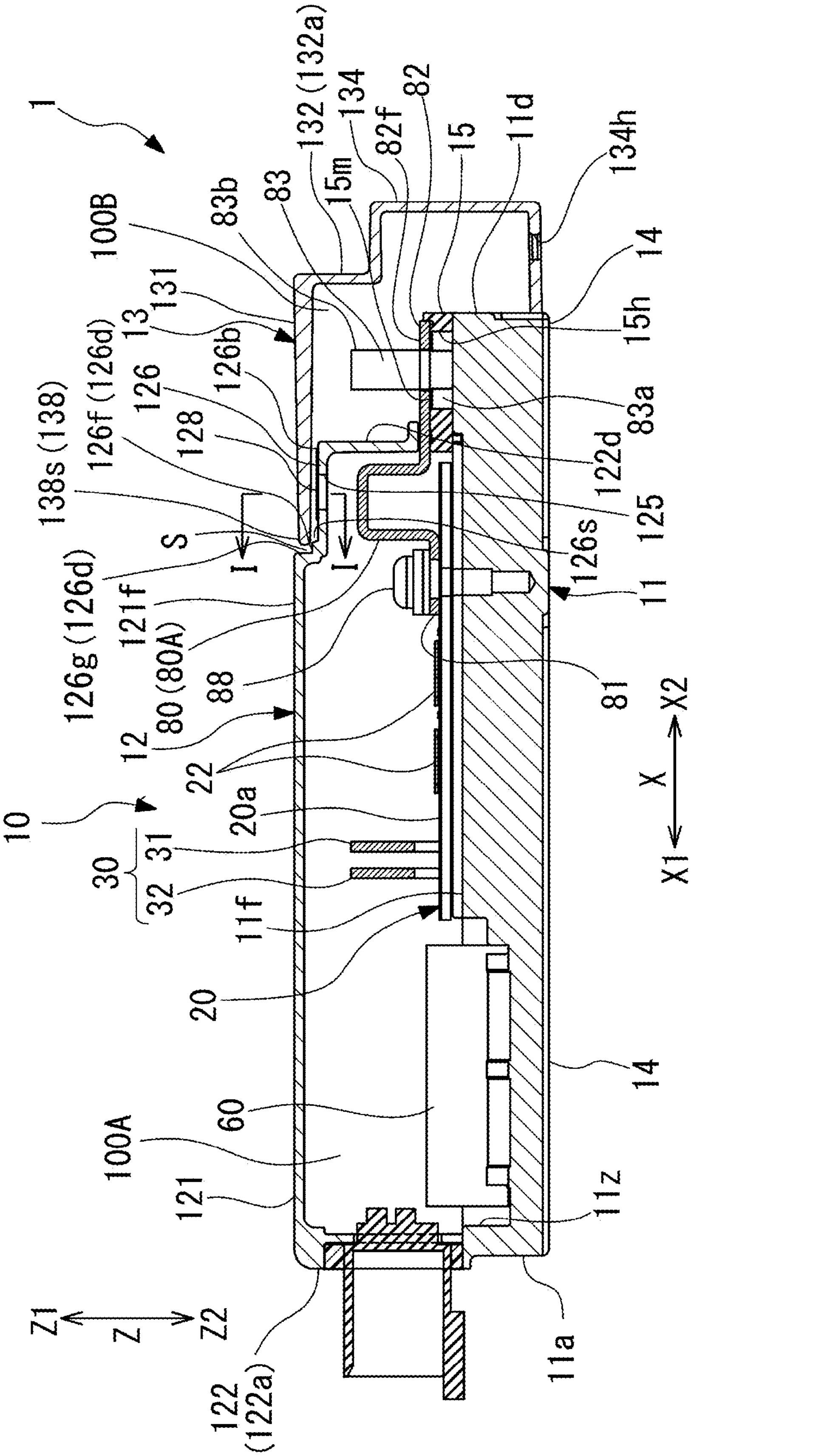
FIG. 4 is a cross-sectional view of the motor control device of FIG.

FIG. 1 is a perspective view showing a motor control device 1 according to an embodiment. FIG. 2 is a perspective view of the motor control device 1 of FIG. 1, seen from a different direction than that of FIG. 1. FIG. 3 is a perspective view showing a state in which a main cover 12 and a sub-cover 13 are removed from the motor control device 1 of FIG. 1. FIG. 4 is a cross-sectional view of the motor control device of FIG. 1.

The motor control device 1 shown in FIG. 1 to FIG. 4 has an inverter function that converts DC power supplied from a battery (not shown) into AC power and drives an AC motor (not shown) with the converted AC power, for example. The motor control device 1 in this embodiment is mounted on a vehicle such as a motorcycle, a motorized bicycle, or an automobile, for example. The motor control device 1 includes a case 10. As shown in FIG. 3 and FIG. 4, the motor control device 1 includes a printed circuit board (board) 20, multiple electrolytic capacitors 60, and multiple terminal connection members 80 within the case 10.

As shown in FIG. 1, FIG. 2, and FIG. 4, the case 10 mainly includes a base member 11, a main cover 12 and the sub-cover 13. As shown in FIG. 3 and FIG. 4, the base member 11 is formed in a box shape with one side open. The printed circuit board 20, the multiple electrolytic capacitors 60, and the multiple terminal connection members 80 are mounted on the base member 11.

Printed Circuit Board 20

The printed circuit board 20 has a plate shape, and has multiple switching elements 22 mounted on a surface (main surface) 20*a* thereof. The printed circuit board 20 is formed in a rectangular shape when viewed in a plate thickness direction Z of the printed circuit board 20 that is perpendicular to the surface 20*a*. The printed circuit board 20 is fixed to a first surface 11*f* of the base member 11.

In the following description, a direction perpendicular to the plate thickness direction Z and along the surface 20*a* of the printed circuit board 20 is referred to as a first direction X, and a direction perpendicular to the plate thickness direction Z and the first direction X is referred to as a second direction Y.

The printed circuit board 20 is a PWB (Printed Wiring Board). The ON/OFF operations of the multiple switching elements 22 are controlled by a switching control circuit (not shown), thereby operating the motor control device 1 under optimal conditions according to the driving state of the AC motor.

Multiple first pattern terminals (not shown) and multiple second pattern terminals (not shown) are provided on the surface 20*a* of the printed circuit board 20 on one side X1 in the first direction X with respect to the multiple switching elements 22. The first pattern terminal is electrically connected to the positive electrode of the switching element 22 via a wiring pattern (not shown) formed on the printed circuit board 20, for example. The second pattern terminal is electrically connected to the negative electrode of the switching element 22 via a wiring pattern (not shown) formed on the printed circuit board 20, for example.

The printed circuit board 20 is provided with a bus bar 30 on one side X1 in the first direction X with respect to the multiple switching elements 22. The bus bar 30 is connected to multiple first pattern terminals and multiple second pattern terminals of the printed circuit board 20. The bus bar 30 is mounted on the surface 20*a* of the printed circuit board 20 by being connected to the multiple first pattern terminals and the multiple second pattern terminals. The bus bar 30 electrically connects the multiple electrolytic capacitors 60 and the multiple switching elements 22.

The bus bar 30 includes a first bus bar 31 and a second bus bar 32. Each of the first bus bar 31 and the second bus bar 32 has a plate shape extending in the second direction Y and is made of a conductive material. The first bus bar 31 is electrically connected to the positive electrode of the switching element 22 via a first pattern terminal and a wiring pattern (not shown). The second bus bar 32 is electrically connected to the negative electrode of the switching element 22 via a second pattern terminal and a wiring pattern (not shown).

Electrolytic Capacitor 60

The multiple electrolytic capacitors 60 are arranged on one side X1 in the first direction X with respect to the printed circuit board 20. The electrolytic capacitors 60 are accommodated in an accommodating recess part 11*z* formed in the base member 11. Each electrolytic capacitor 60 is formed, for example, in a cylindrical shape. Each of the electrolytic capacitors 60 is disposed with its axial direction aligned along the first direction X. The multiple electrolytic capacitors 60 are arranged in parallel in the second direction Y. In this embodiment, for example, eight electrolytic capacitors 60 are arranged in parallel in the second direction Y.

As shown in FIG. 3, each of the electrolytic capacitors 60 has a first lead terminal 61 and a second lead terminal 62. The first lead terminal 61 and the second lead terminal 62 are provided in the second direction Y with an interval therebetween. The first lead terminal 61 is connected to the first bus bar 31. The second lead terminal 62 is connected to the second bus bar 32.

In this manner, the electrolytic capacitor 60 is electrically connected to the switching element 22 via the bus bar 30. The electrolytic capacitor 60 suppresses fluctuations in the DC voltage caused by the switching operation of the switching element 22.

In the embodiment, the electrolytic capacitor 60 is described as an example of the capacitor, but the capacitor is not limited to the electrolytic capacitor 60. As another example, a capacitor having a sufficiently large capacitance capable of suppressing the fluctuation of the DC voltage within a target value may be used.

Terminal Connection Member 80

As shown in FIG. 3 and FIG. 4, the terminal connection member 80 is provided on the other side X2 in the first direction X with respect to the multiple switching elements 22. The terminal connection members 80 are arranged in parallel in the second direction Y. In the present embodiment, five terminal connection members 80 are arranged in the second direction Y.

Each of the terminal connection members 80 extends in the first direction X. Each of the terminal connection members 80 has an element connection part 81 on one side X1 in the first direction X. As shown in FIG. 3, of the five terminal connection members 80, the element connection parts 81 of three terminal connection members 80A arranged in the center in the second direction Y are fixed to the printed circuit board 20 by screws 88 and connected to the multiple switching elements 22 via a wiring pattern (not shown) formed on the surface 20*a* of the printed circuit board 20. Of the five terminal connection members 80, the element connection parts 81 of two terminal connection members 80B provided at two ends in the second direction Y are fixed to the printed circuit board 20 by the screws 88 and connected to a wiring pattern (not shown) formed on the surface 20*a* of the printed circuit board 20.

As shown in FIG. 3 and FIG. 4, each of the terminal connection members 80 has a terminal part 82 on the other side X2 in the first direction X. The terminal part 82 of each of the terminal connection members 80 is fixed to a spacer 15 attached to the first surface 11*f* of the base member 11. The spacer 15 extends in the second direction Y when viewed from the plate thickness direction Z. The spacer 15 has a predetermined thickness in the plate thickness direction Z. The spacer 15 has an accommodating groove 15*m* that extends in the first direction X and that accommodates the terminal part 82. The accommodating groove 15*m* is recessed from a surface 15*f* of the spacer 15 toward a second side Z2 in the plate thickness direction Z. The surface 15*f* of the spacer 15 and a surface 82*f* of the terminal part 82 accommodated in the accommodating groove 15*m* are along the same plane intersecting the plate thickness direction Z.

The spacer 15 has, at two ends in the second direction Y, a locked part 15*s* that protrudes toward the second side Z2 in the plate thickness direction Z. The spacer 15 is so-called snap-fitted by engaging the locked part 15*s* with a locking claw 11*t* formed on the base member 11.

An external wiring (not shown) is detachably connected to the terminal part 82 by a bolt 83 and a nut (not shown). As shown in FIG. 4, the spacer 15 is formed with a bolt receiving hole 15*h* for receiving a head part 83*a* of the bolt 83 therein. A shaft part 83*b* of the bolt 83 penetrates the terminal part 82 and protrudes toward a first side Z1 in the plate thickness direction Z with respect to the terminal part 82.

Here, of the five terminal connection members 80, the terminal parts 82 of the three terminal connection members 80A arranged in the center in the second direction Y are connected to external wiring for supplying U-phase, V-phase, and W-phase driving currents to a motor (not shown). Of the five terminal connection members 80, the terminal parts 82 of the two terminal connection members 80B arranged at two ends in the second direction Y are connected to external wiring for connection to a power source and ground.

Base Member 11

As shown in FIG. 1, FIG. 2, and FIG. 4, the base member 11 is provided with multiple heat dissipating fins 14 in a part where the printed circuit board 20 and the multiple electrolytic capacitors 60 are housed. The multiple fins 14 are provided at intervals in the second direction Y. Each of the fins 14 protrudes from the base member 11 toward the second side Z2 in the plate thickness direction Z and extends in the first direction X. The multiple fins 14 dissipate heat generated by the multiple electrolytic capacitors 60, the bus bar 30 mounted on the printed circuit board 20, the multiple switching elements 22, the multiple terminal connection members 80, etc., to the outside of the base member 11.

Figure 5:
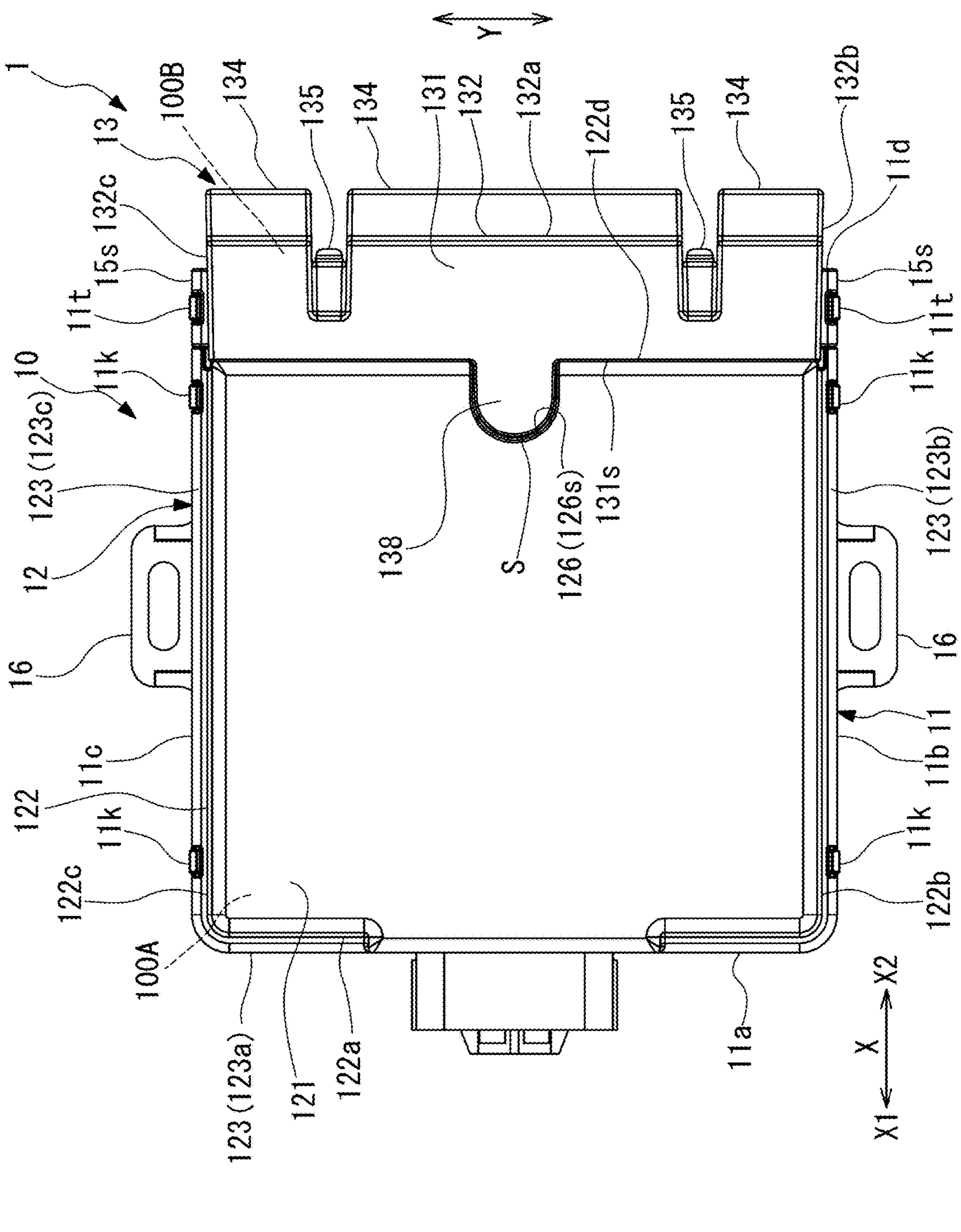
FIG. 5 is a plan view of the motor control device of FIG. 1.

FIG. 5 is a plan view of the motor control device 1 of FIG. 1.

As shown in FIG. 1, FIG. 2, and FIG. 5, the base member 11 is provided with a stay 16 that protrudes on both sides in the second direction Y. The base member 11 (motor control device 1) is fixed to a vehicle body having a motor (not shown) by bolts (not shown) inserted through the stay 16.

Main Cover 12

Figure 6:
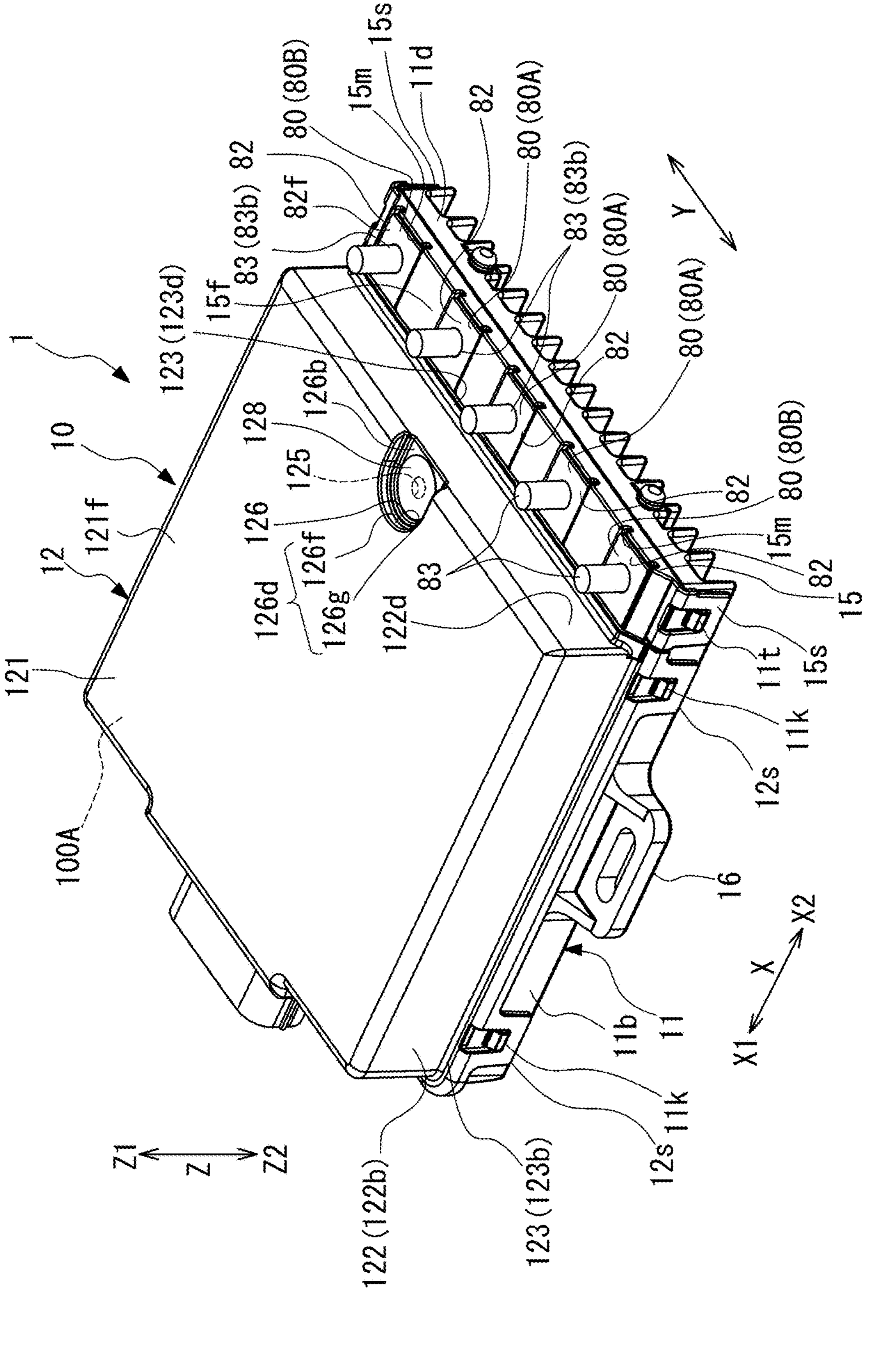
FIG. 6 is a perspective view showing a state in which a sub-cover is removed from the motor control device of FIG. 1.

FIG. 6 is a perspective view showing a state in which the sub-cover 13 is removed from the motor control device 1 of FIG. 1.

As shown in FIG. 4 and FIG. 6, the main cover 12 is provided to cover the multiple electrolytic capacitors 60 housed in the base member 11 and the printed circuit board 20. As shown in FIG. 1, FIG. 2, and FIG. 5, the main cover 12 integrally includes a plate-shaped part 121 and a peripheral wall part 122, and is formed in a box shape that opens to the second side Z2 in the plate thickness direction Z.

The plate-shaped part 121 extends along a plane intersecting with the plate thickness direction Z. The plate-shaped part 121 is formed in a rectangular shape when viewed in the plate thickness direction Z. The dimension of the plate-shaped part 121 in the Y direction is equal to that of the base member 11. The dimension of the plate-shaped part 121 in the X direction is smaller than that of the base member 11. Thus, when viewed in the plate thickness direction Z, the base member 11 protrudes toward the other side X2 in the first direction X with respect to the plate-shaped part 121.

The peripheral wall part 122 rises from the four sides of the plate-shaped part 121 toward the second side Z2 in the plate thickness direction Z. Here, in the peripheral wall part 122, a wall part 122*a* provided on one side X1 in the first direction X and wall parts 122*b*, 122*c* provided on both sides in the second direction Y are provided at positions overlapping with the three side surfaces 11*a*, 11*b*, 11*c* along the outer peripheral edge of the base member 11, respectively, when viewed from the plate thickness direction Z. As shown in FIG. 4 and FIG. 6, in the peripheral wall part 122, a wall part 122*d* provided on the other side X2 in the first direction X is provided at a position shifted to one side X1 in the first direction X with respect to a remaining side surface 11*d* along the outer peripheral edge of the base member 11. As a result, the terminal parts 82 of the multiple terminal connection members 80 protrude from the wall part 122*d* toward the other side X2 in the first direction X.

As shown in FIG. 1, FIG. 2, and FIG. 5, at the tip part on the second side Z2 in the plate thickness direction Z of the peripheral wall part 122, a flange part 123 is formed extending outward from the peripheral wall part 122. Flange parts 123*a*, 123*b*, and 123*c* of the wall parts 122*a*, 122*b*, and 122*c* are in close contact with the outer peripheral edge part of the first surface 11*f* of the base member 11 via a sealant such as a liquid gasket. In this case, the space enclosed by the base member 11 and the main cover 12 in the case 10 constitutes a first space 100A.

As shown in FIG. 6, the flange part 123*d* connected to the wall part 122*d* is in close contact with the surface 15*f* of the spacer 15 and the surface of the terminal part 82 via a sealant such as a liquid gasket.

In this manner, the electrolytic capacitors 60 and the printed circuit board 20 are housed in a space sealed by the base member 11, the spacer 15, and the main cover 12.

As shown in FIG. 1 and FIG. 2, the main cover 12 has, at two ends in the second direction Y, a locked part 12*s* that protrudes toward the second side Z2 in the plate thickness direction Z. The main cover 12 is so-called snap-fitted by engaging the locked part 12*s* with a locking claw 11*k* formed on the side surfaces 11*b*, 11*c* of the base member 11.

Sub-Cover 13

As shown in FIG. 2 and FIG. 4, the sub-cover 13 is provided on the other side X2 in the first direction X with respect to the main cover 12. The sub-cover 13 is formed in a box shape that is open to the second side Z2 in the plate thickness direction Z and to one side X1 in the first direction. The sub-cover 13 is provided to cover the terminal parts 82 of the multiple terminal connection members 80 that protrude from the wall part 122*d* of the main cover 12 toward the other side X2 in the first direction X. The sub-cover 13 integrally includes a base part 131 and a side wall part 132. The base part 131 extends along a plane intersecting the plate thickness direction Z. The base part 131 is formed in a rectangular shape when viewed in the plate thickness direction Z. The base part 131 is provided on the same plane as the plate-shaped part 121 of the main cover 12.

The side wall part 132 rises from the outer peripheral edge of the base part 131 toward the second side Z2 in the plate thickness direction Z. The side wall part 132 has a wall part 132*a* provided on the other side X2 in the first direction X, and wall parts 132*b* and 132*c* provided on both sides in the second direction Y. Such a sub-cover 13 is open to the second side Z2 in the plate thickness direction Z and to one side X1 in the first direction X by the base part 131 and the side wall part 132.

Moreover, the sub-cover 13 has multiple protruding parts 134 protruding to the other side X2 in the first direction X on the second side Z2 in the plate thickness direction Z with respect to the wall part 132*a*. The protruding parts 134 are arranged in the second direction Y at intervals. As shown in FIG. 4, in the protruding part 134, a surface facing the second side Z2 in the plate thickness direction Z is formed with a wiring insertion hole 134*h* through which an external wiring is inserted. End parts of the external wiring are pulled into the sub-cover 13 through the wiring insertion hole 134*h*, and then connected to the terminal parts 82 individually within the sub-cover 13. As shown in FIG. 5, the sub-cover 13 is detachably fixed to the side surface 11*d* of the base member 11 by screws 135.

Figure 7:
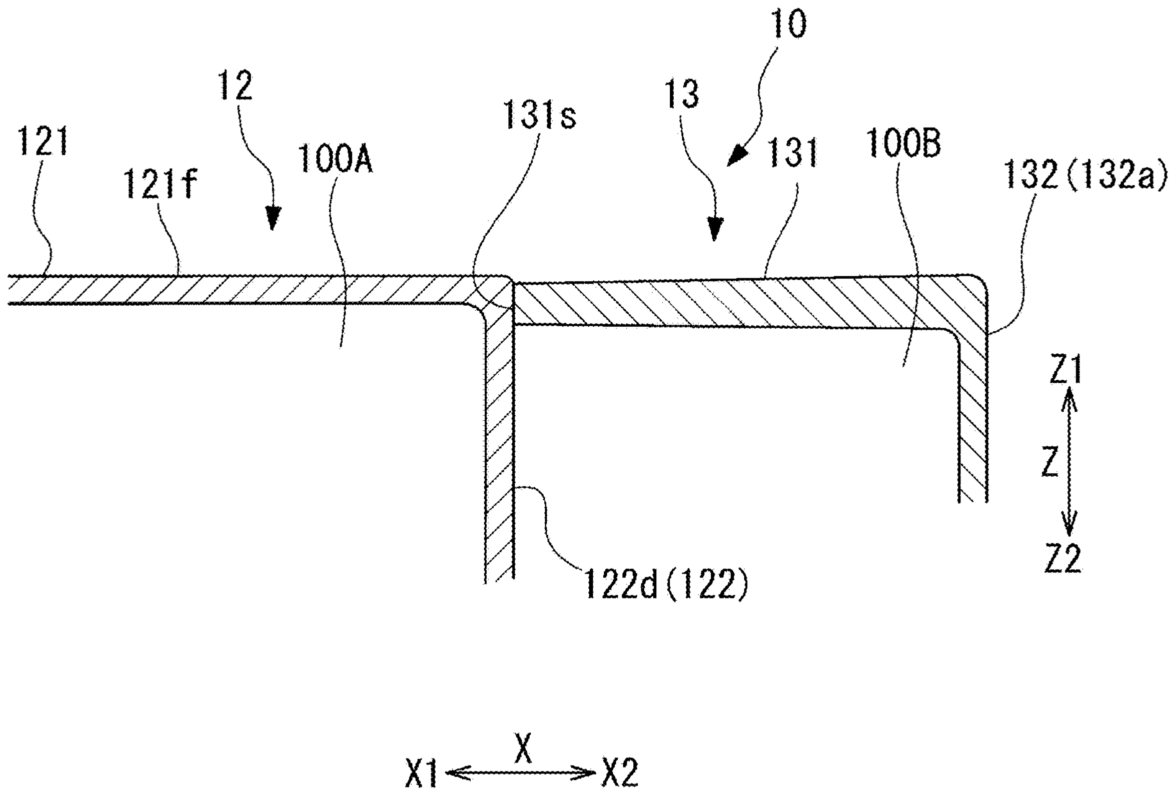
FIG. 7 is an enlarged cross-sectional view showing a contact part between the main cover and the sub-cover.

FIG. 7 is an enlarged cross-sectional view showing a contact part between the main cover 12 and the sub-cover 13.

As shown in FIG. 5 and FIG. 7, an edge 131*s* on the one side X1 in the first direction X of the base part 131 of the sub-cover 13 is in contact with the wall part 122*d* of the main cover 12. Specifically, the edge 131*s* abuts against the wall part 122*d* from the other side X2 in the first direction X. However, the edge 131*s* may overlap with the wall part 122*d* or the plate-shaped part 121 from the first side Z1 in the plate thickness direction Z, as long as it is configured to bring the main cover 12 and the sub-cover 13 into close contact with each other.

In the case 10, the space enclosed by the base member 11 and the sub-cover 13 constitutes a second space 100B. The first space 100A and the second space 100B are partitioned by the wall part 122*d*.

Filter 128

Figure 8:
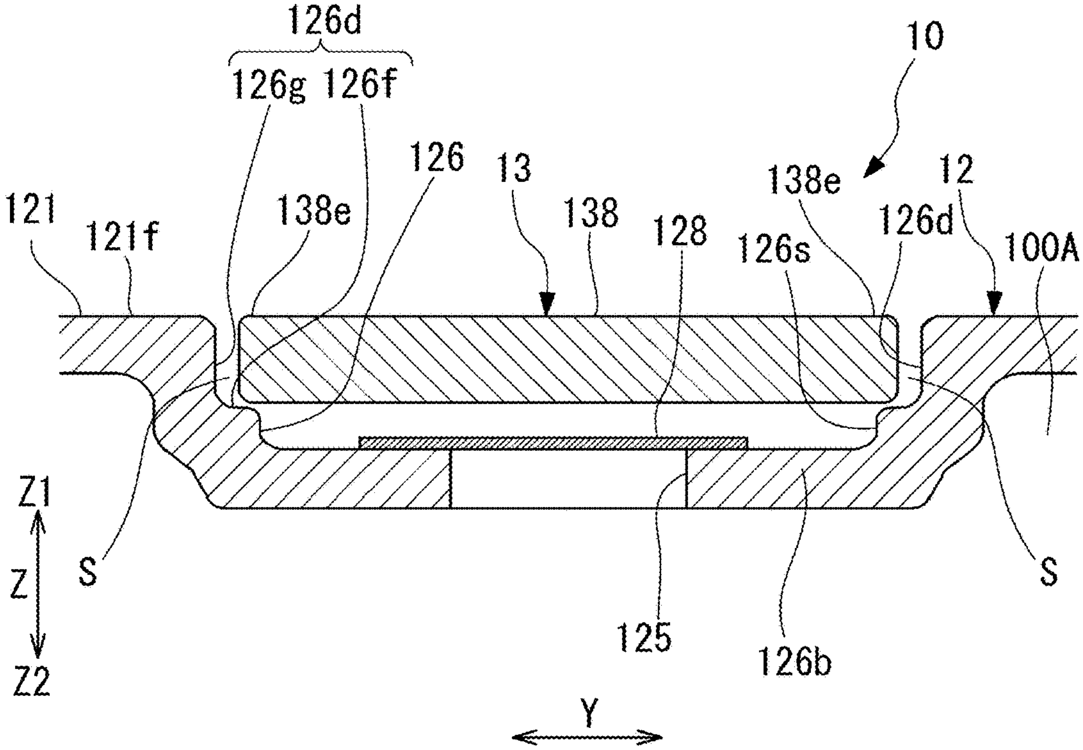
FIG. 8 is a cross-sectional view taken along line I-I in FIG. 4.
Figure 9:
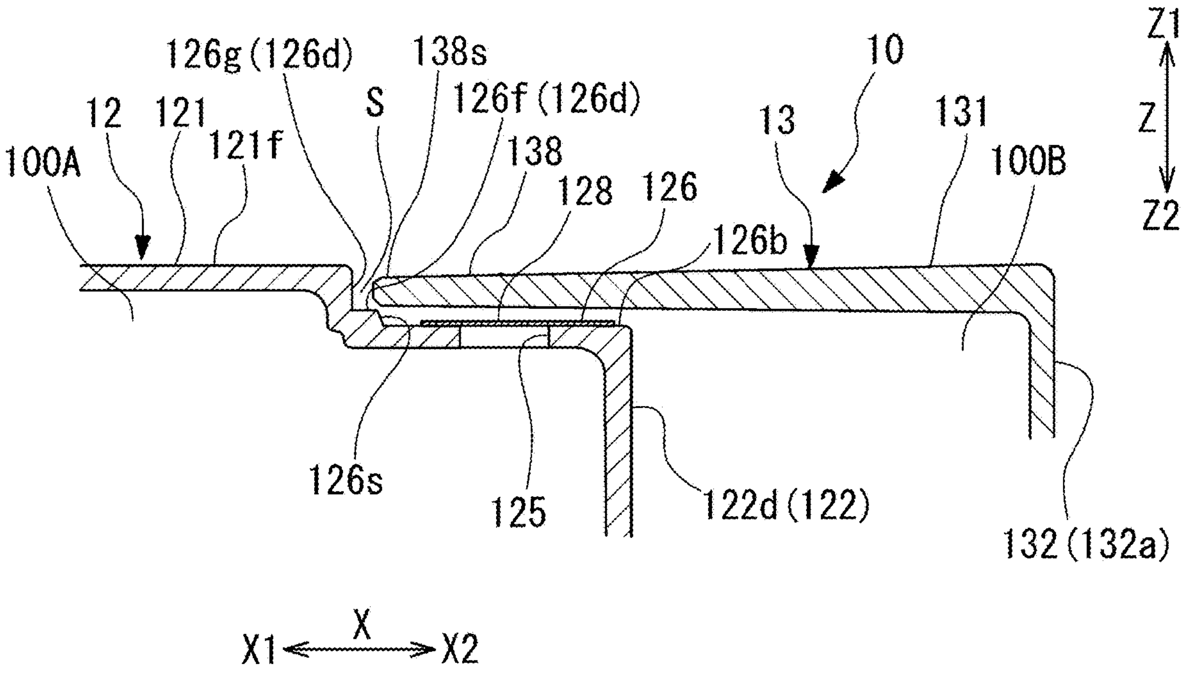
FIG. 9 is an enlarged cross-sectional view showing a filter and a filter cover part of the motor control device.

FIG. 8 is a cross-sectional view taken along line I-I of FIG. 4. FIG. 9 is an enlarged cross-sectional view showing a filter 128 and a filter cover part 138 of the motor control device 1.

As shown in FIG. 4, FIG. 6, FIG. 8, and FIG. 9, the main cover 12 is provided with the filter 128. A communication hole 125 is formed at the end part of the plate-shaped part 121 on the other side X2 in the first direction X. The communication hole 125 is formed in the center of the plate-shaped part 121 in the second direction Y. The communication hole 125 is formed in a bottom wall 126*b* of a recess part 126 formed in the plate-shaped part 121.

The recess part 126 is recessed from an outer surface 121*f* of the plate-shaped part 121 facing the first side Z1 in the plate thickness direction Z toward the second side Z2 in the plate thickness direction Z. The recess part 126 is formed, for example, in a U-shape when viewed in the plate thickness direction Z. The recess part 126 has the bottom wall 126*b* and a peripheral wall 126*s*. The bottom wall 126*b* is provided on the second side Z2 in the plate thickness direction Z with respect to the plate-shaped part 121. The bottom wall 126*b* extends along a plane intersecting with the plate thickness direction Z. An end part of the bottom wall 126*b* on the other side X2 in the first direction X is connected to the wall part 122*d*. The peripheral wall 126*s* extends in a U-shape along the outer peripheral edge of the bottom wall 126*b* when viewed in the plate thickness direction Z. The peripheral wall 126*s* connects the outer peripheral edge of the bottom wall 126*b* and the plate-shaped part 121. The recess part 126 opens onto the outer surface 121*f* and onto a surface of the wall part 122*d* facing the other side X2 in the first direction X.

The communication hole 125 penetrates the bottom wall 126*b* of the recess part 126 in the plate thickness direction Z. As a result, the communication hole 125 communicates between the inside and the outside of the case 10 (first space 100A). Moreover, the peripheral wall 126*s* has a step part 126*d* at its end part on the first side Z1 in the plate thickness direction Z, in which the inner diameter dimension of the recess part 126 is enlarged in a direction intersecting the plate thickness direction Z of the recess part 126 with respect to its end part on the second side Z2 in the plate thickness direction Z. The inner peripheral surface of the step part 126*d* includes a hanging surface 126*g* extending from the opening edge of the first side Z1 of the recess part 126 in the plate thickness direction Z to the second side Z2 in the plate thickness direction Z, and a step surface 126*f* extending from the end part of the hanging surface 126*g* on the second side Z2 in the plate thickness direction Z toward the inside of the recess part 126.

The filter 128 is provided in the recess part 126 so as to cover the communication hole 125. The filter 128 is made of a material that allows air to pass through but prevents the passage of rainwater and foreign matter. In this embodiment, the communication hole 125 and the filter 128 are formed, for example, in a circular shape when viewed in the plate thickness direction Z. The filter 128 may be adhered or welded to a part of the bottom wall 126*b* that is positioned around the communication hole 125, or may simply be placed on the bottom wall 126*b*.

As shown in FIG. 1, FIG. 2, FIG. 4, FIG. 5, and FIG. 9, the sub-cover 13 is provided with a filter cover part 138. The filter cover part 138 is integrally formed at an end part on one side X1 in the first direction X of the base part 131. The filter cover part 138 is provided in the center in the second direction Y. The filter cover part 138 is provided so as to protrude from the base part 131 toward one side X1 in the first direction X. The filter cover part 138 is provided on the same plane as the base part 131. The filter cover part 138 is formed, for example, in a substantially U-shape when viewed in the plate thickness direction Z. In the example shown, the plate thickness of the filter cover part 138 gradually becomes thinner toward one side X1 in the first direction X.

As shown in FIG. 4, FIG. 8, and FIG. 9, the filter cover part 138 is provided in the recess part 126 so as to face the bottom wall 126*b* in the plate thickness direction Z with the filter 128 interposed therebetween. The filter cover part 138 is spaced apart from the filter 128 on one side X1 in the plate thickness direction Z.

When viewed from the plate thickness direction Z, a small gap S is provided between the filter cover part 138 and the recess part 126. The size of the gap S is set to a level that allows gas to pass through but does not allow liquid or dust to pass through easily. More specifically, as shown in FIG. 9, when viewed from the second direction Y, a tip part 138*s* of the outer peripheral edge of the filter cover part 138 on one side X1 in the first direction X is positioned within the step part 126*d* (overlapping the step part 126*d* when viewed from the plate thickness direction Z). The tip part 138*s* is spaced apart in the first direction X from the hanging surface 126*g* within the step part 126*d*. The tip part 138*s* is spaced apart from the step surface 126*f* on the first side Z1 in the plate thickness direction Z within the step part 126*d*.

Moreover, as shown in FIG. 8, end parts 138*e* of the outer peripheral edge of the filter cover part 138 on both sides in the second direction Y are positioned within the step part 126*d* (overlapping the step part 126*d* when viewed from the plate thickness direction Z). The end part 138*e* is spaced apart in the first direction X from the hanging surface 126*g* within the step part 126. The end part 138*e* is spaced apart from the step surface 126*f* on the first side Z1 in the plate thickness direction Z within the step part 126*d*. Thus, the gap S extends around the entire circumference between the outer peripheral edge of the filter cover part 138 and the inner peripheral surface of the peripheral wall 126*s*, and has an L-shape in cross section. Thus, it is difficult for rainwater or foreign matter to enter from the outside through the gap S. Furthermore, since the outer peripheral edge (tip part 138*s* and the end part 138*e*) of the filter cover part 138 faces the step surface 126*f* in the plate thickness direction Z, when the filter cover part 138 is deformed toward the second side Z2 in the plate thickness direction Z due to an external force or the like, the outer peripheral edge of the filter cover part 138 abuts against the step surface 126*f*. This prevents the filter cover part 138 from being excessively deformed. However, it is sufficient that at least a partial gap S is provided between the outer peripheral surface of the filter cover part 138 and the inner peripheral surface of the peripheral wall 126*s*.

By providing such a filter cover part 138, the first space 100A covered by the main cover 12 communicates with the outside through the communication hole 125, the filter 128, the space between the filter 128 and the filter cover part 138, and the gap S.

Thus, in this embodiment, the filter 128 is provided to cover the communication hole 125 formed in the main cover 12, and the filter cover part 138 that covers the filter 128 is provided on the sub-cover 13.

With this configuration, since the filter cover part 138 is provided to cover the filter 128, it is possible to prevent external forces such as high-pressure water or flying stones from acting on the filter 128, and it is possible to prevent water and dust from entering the case 10 and to allow gas to enter and exit the case 10 in response to pressure changes therein without using a special filter that has been designed to protect against the above-mentioned external forces. Moreover, since the sub-cover 13 integrally includes the filter cover part 138, the filter cover part 138 covering the filter 128 is set when the main cover 12 and the sub-cover 13 are attached to the base member 11. Thus, it is possible to provide a motor control device 1 having a filter cover part 138 with a simple configuration while suppressing an increase in the number of parts and assembly man-hours.

Moreover, since it is possible to provide the motor control device 1 with a simple configuration while suppressing increases in the number of parts and assembly man-hours, it will be possible to contribute to Goal 7 of the Sustainable Development Goals (SDGs) led by the United Nations, which is to "Ensure access to affordable, reliable, sustainable and modern energy for all" and Goal 9, which is to "Build resilient infrastructure, promote inclusive and sustainable industrialization and foster innovation".

In this embodiment, the filter 128 and the filter cover part 138 are provided in the recess part 126 formed in the main cover 12.

With this configuration, the filter cover part 138 that covers the filter 128 may be provided with a simple configuration. Furthermore, by providing the filter cover part 138 inside the recess part 126, the motor control device 1 may be configured compactly in the plate thickness direction Z.

In this embodiment, the filter cover part 138 is provided spaced apart from the filter 128 on the first side Z1 in the plate thickness direction Z, and when viewed from the plate thickness direction Z, the gap S is formed between the filter cover part 138 and the recess part 126.

With this simple configuration, it is possible to ensure good ventilation between the inside and the outside of the main cover 12 through the filter 128, while the filter cover part 138 effectively prevents rainwater and foreign matter from the outside from reaching the filter 128.

The present invention is not limited to the above-described embodiment, and includes various modifications to the above-described embodiment without departing from the spirit of the present invention.

For example, in the above embodiment, the case 10 includes the multiple electrolytic capacitors 60, the printed circuit board 20 on which the multiple switching elements 22 are mounted, and the terminal connection member 80, but the number and positions of these components may be changed as appropriate.

In the above embodiment, the configuration in which the communication hole 125 opens to the bottom wall 126*b* of the recess part 126 has been described, but the present invention is not limited to this configuration. The communication hole 125 may be formed in, for example, the plate-shaped part 121 or the peripheral wall part 122.

In the above embodiment, the configuration in which the communication hole 125 is provided at only one location has been described, but the present invention is not limited to this configuration. The communication hole 125 may be provided at multiple locations.

In the above embodiment, the configuration in which the filter cover part 138 is provided inside the recess part 126 has been described, but the present invention is not limited to this configuration. The filter cover part 138 may be provided in a state where it bulges out from the main cover 12.

Moreover, within the scope of the invention, the components in the above-described embodiments may be replaced with well-known components, and the above-described modified examples may be combined as appropriate.

What is claimed is:

1. A motor control device comprising:

a board on which a switching element for driving a motor is mounted;

a terminal connection member having an element connection part connected to the switching element and a terminal part to which an external wiring is detachably connected, the terminal connection member extending in a first direction along a main surface of the board; and a case accommodating the switching element, the board, and the terminal connection member, wherein the case comprises:

a base member that has a first surface to which the board is fixed;

a main cover that covers at least a part of the first surface of the base member where the board is provided and that is attached to the base member in a state in which the terminal part protrudes in the first direction;

a filter that is provided to cover a communication hole formed in the main cover and communicating between inside and outside of the case and that allows air to pass through; and a sub-cover that is detachably provided with respect to the base member so as to cover the terminal part, wherein the sub-cover integrally includes a filter cover part provided to cover the filter.

2. The motor control device according to claim 1, wherein the main cover comprises:

an outer surface facing a first side in a plate thickness direction of the board; and a recess part having a bottom wall through which the communication hole opens and opening to the first side in the plate thickness direction on the outer surface, wherein the filter is provided in the recess part so as to cover the communication hole, and the filter cover part is provided in the recess part so as to face the bottom wall in the plate thickness direction with the filter interposed therebetween.

3. The motor control device according to claim 2, wherein the filter cover part is provided on the first side in the plate thickness direction spaced apart from the filter, and a gap is formed between the filter cover part and the recess part when viewed from the plate thickness direction.

* * * * *